United States Patent [19]

Bate

[11] 3,829,883

[45] Aug. 13, 1974

[54] MAGNETIC FIELD DETECTOR EMPLOYING PLURAL DRAIN IGFET

[76] Inventor: Robert Thomas Bate, 512 Westshore Dr., Richardson, Tex. 75080

[22] Filed: Nov. 9, 1973

[21] Appl. No.: 414,570

Related U.S. Application Data

[63] Continuation of Ser. No. 285,291, Aug. 31, 1972.

[52] U.S. Cl. ..... 317/235 R, 317/235 B, 317/235 H, 317/235 Z, 324/43 R

[51] Int. Cl. .............................................. H01l 17/00

[58] Field of Search .......... 317/235, 21.1, 23, 40.13

[56] References Cited

UNITED STATES PATENTS

| | | | |
|---|---|---|---|
| 3,305,790 | 2/1967 | Parsons et al. | 317/235 |
| 3,448,353 | 6/1969 | Gallagher et al. | 317/235 |
| 3,702,991 | 11/1972 | Bate et al. | 317/235 |

*Primary Examiner*—Rudolph V. Rolinec
*Assistant Examiner*—E. Wojciechowicz
*Attorney, Agent, or Firm*—Harold Levine; Edward J. Connors, Jr.; William E. Hiller

[57] ABSTRACT

A mode of operation of a three-drain configured insulated gate field effect transistor which is extremely sensitive to magnetic fields is disclosed. The gate of the transistor is biased to a level less than transistor threshold, or alternatively, is connected to substrate ground. A first drain region opposite the source is biased to achieve avalanche breakdown of the junction. The other two drains are defined on either side of a line joining the source and first drain. These two drains are biased at a voltage below that required for avalanche of their junctions. In response to a magnetic field a voltage difference is generated across these two drains. In one embodiment of the invention, the region opposite the source is of a conductivity type the same as the substrate. In this configuration the detector does not require avalanche breakdown.

5 Claims, 6 Drawing Figures

MAGNETIC FIELD DETECTOR EMPLOYING PLURAL DRAIN IGFET

This is a continuation, of application Ser. No. 285,291, filed Aug. 31, 1972.

The present invention relates to magnetic field sensors in general and more particularly to an insulated gate field effect transistor magnetic field detector.

In many applications, particularly those requiring contactless switching, it is desirable to have an IGFET sensing structure that is responsive to the presence of a magnetic field. Such detectors could be utilized for example, in ground fault interruptors, magnetic tape pickups, keyboards and etc. Experimental structures of this type are described in Fry et al, *IEEE Transactions on Electron Devices*, Volume ED–16, page 35, 1969 and Carr et al, 1970 SWIEEECO Record of Technical Papers. Apr. 21–24, 1970 Dallas, Tex. A major problem associated with IGFET magnetic field sensors relates to the difficulty of obtaining sufficiently large output signals. A correlated problem relates to the problem of achieving acceptable signal to noise ratios. Accordingly, an object of the present invention is to provide an improved magnetic field detector.

An additional object of the invention is to provide a magnetic field detector having increased sensitivity and signal to noise ratio.

A further object of the invention is to provide a mode of operation of a three-drain configured IGFET having extremely high sensitivity.

Briefly and in accordance with the present invention a mode of operation of a three-drain configured insulated gate field effect transistor is disclosed. This mode of operation is characterized by extremely high sensitivity to magnetic fields. The IGFET comprises, on one surface of a semiconductor substrate, a source diffusion and a first drain diffusion opposite the source and spaced therefrom. Second and third drain diffusions are defined on opposite sides of a line joining the source and first drain diffusions. A thin oxide or insulating region covers these diffusions and a highly conductive gate region is formed to overlie at least part of each of the diffusions. Conventional fabrication techniques and doping types and levels required for insulated gate field effect transistors may be utilized. The magnetic field detector is operated in a mode characterized by a gate bias that is less than the transistor threshold. The first drain is biased to produce avalanche breakdown of the junction with the substrate and the second and third drains are biased to a voltage slightly below that required for avalanche breakdown of their junctions. The output of the detector is taken across the second and third drains. In response to a magnetic field an output current change is generated across these two drains due to deflected charge carriers.

In a different embodiment of the invention the first drain region is replaced by a highly conductive region of the same conductivity type as the substrate. This region is biased to produce a current between the source diffusion and this last mentioned region. In some applications it may be desirable to form a gate type structure to overlie a portion of each of the diffused regions in order to confine minority carriers to a designated area.

These and other objects and advantages of the invention will become apparent upon reading the following specification in view of the drawings wherein.

Figure 1:
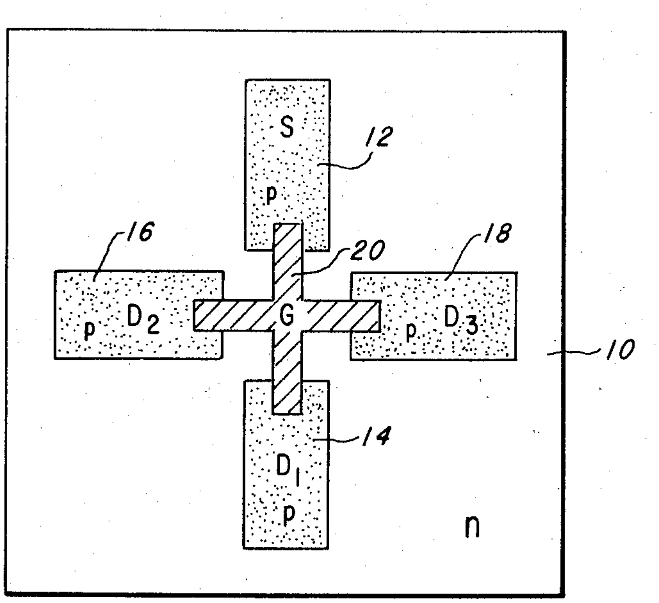
FIGS. 1–3 are plan views of different arrangements of three-drain configured IGFETs that have been utilized in accordance with the high sensitivity mode of operation of the present invention.

With reference now to the drawings, FIG. 1 illustrates the preferred embodiment of the present invention utilizing a three-drain configured insulated gate field effect transistor. By way of example, an N-type silicon wafer may be used as the substrate for forming a P-channel transistor. It is to be understood of course that N-channel transistors may be utilized in accordance with the teachings of the present invention. The N-type substrate is shown generally at 10. Utilizing conventional fabrication techniques, diffusions are effected to form spaced apart pockets of opposite conductivity type material extending to the surface of the substrate 10. One of these diffused pockets 12 forms the source of the transistor. The diffused region 14 opposite the source forms one drain of the transistor. Diffused regions 16 and 18 form the other two drains of the device and are formed on opposite sides of a line joining the source 12 and the drain 14. A continuous thin layer of insulating material (not shown) is formed to extend over at least a portion of each of the diffused regions 12, 14, 16 and 18. This insulating layer may, for example, comprise silicon oxide or silicon nitride and may be formed by conventional techniques. Typically this thin insulating layer is of a thickness on the order of from 500 – 1,000 A. A layer 20 of conductive material is formed to overlie the insulating region so as to define a channel region thereunder in the surface of the substrate 10. As understood by those skilled in the art, when a bias signal large enough to exceed the threshold voltage of the transistor is applied to the conductive region 20, i.e., the gate of the transistor, the semiconductor material in the channel underlying the gate is inverted in conductivity type. Thus, for the illustrative example wherein a N-type substrate is used, in response to a sufficient bias voltage applied to the gate 20, a P-type channel is formed connecting the source 12 and the drain 14. For this situation, and where a negative bias voltage is applied to the drain 14, a current flows from the source to the drain. Similarly, for the example shown in FIG. 1, an inverted channel region is formed under the portion of the gate 20 extending over the drains 16 and 18. In normal operation the drains 16 and 18 are biased to the same level and there is no current flow therebetween. In the presence of a magnetic field however, the Lorentz Force diverts current (holes) toward the drain 18 (for the situation where the magnetic field is applied into the sheet of the drawing). In an appropriate circuit, of the type illustrated in FIG. 6, this generates a voltage difference between the drains 16 and 18 which may be detected as representative of the presence of a magnetic field.

Figure 4:
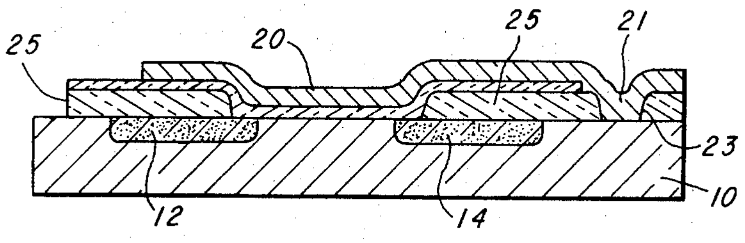
FIG. 4 is a cross section of a substrate illustrating ohmic contact of the gate electrode to the substrate.

The conventional mode of operating a transistor such as configured in FIG. 1 to detect a magnetic field is to bias the gate 20 beyond threshold. The gate is typically biased with a voltage on the order of a minus 15 volts. The best sensitivity observed for such a configuration is about 40 micro-volts/Oersted. In accordance with the present invention however, a new mode of operation is utilized. In this mode of operation the source is biased to a level below the threshold required to invert the channel. This may conveniently be accomplished by connecting the source to circuit ground which insures that the gate electrode does not charge up to threshold voltage. Such a configuration is illustrated in FIG. 4, which is a cross section of a structure, such as FIG. 1. As may be seen, the gate electrode 20 is ohmically connected to the substrate 10 by conductive path 21. This interconnect may be formed at the same time the gate electrode is formed using conventional techniques. The conductive path 21 extends through an aperture 23 in a thick insulating layer 25 to make contact to the substrate 10. Further, the drain 14 opposite the source 12 is biased with a voltage sufficient to cause avalanche breakdown of the junction between the P-type region 14 and the substrate 10. A voltage in the range of minus 50–90 volts or greater may be utilized to effect avalanche breakdown. The avalanche breakdown generates hole-electron pairs and enables hole current flow from the source to the drain. These carriers are minority carriers since the substrate region under the gate has not been inverted to a P-type region. The two drain regions 16 and 18 are biased to a voltage slightly below that required to produce avalanche at the respective junctions. It is believed that this relatively high bias voltage on these drains accelerates holes that are diverted by a magnetic field and improves sensitivity. In this mode of operation a sensitivity on the order of 1,500 microvolts/Oersted has been observed. Similarly this high sensitivity mode is characterized as having a substantially improved signal-to-noise ratio. The signal-to-noise may be expressed conveniently as the root-mean-square noise equivalent magnetic field. This value is obtained by measuing the noise signal or output signal generated when the device is biased in its operating condition but is not subjected to any magnetic field. The magnitude of the output signal is expressed in terms of a magnetic field which would generate the same magnitude of signal. For example, if the noise were measured at a certain frequency and bandwidth and the value obtained defined as 1 Oersted $Hz^{-1}/2$,, this would be the equivalent of stating that in the absence of any noise whatsoever the magnitude of the signal obtained would be the equivalent to an applied magnetic field of 1 Oersted. Using this convention, the signal-to-noise equivalent magnetic field of a conventionally operated three-drain configured insulated gate field effect transistor has a value of about 0.7 Oersted $Hz^{-1}/2$. This is to be contrasted to the high sensitivity mode of operation of the present invention wherein the equivalent magnetic field has a measured value of about 0.04 Oersted $Hz^{-1}/2$.

Figure 2:
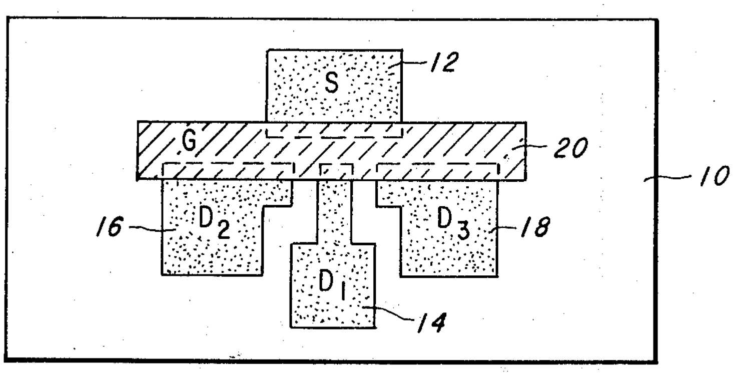
Figure 3:
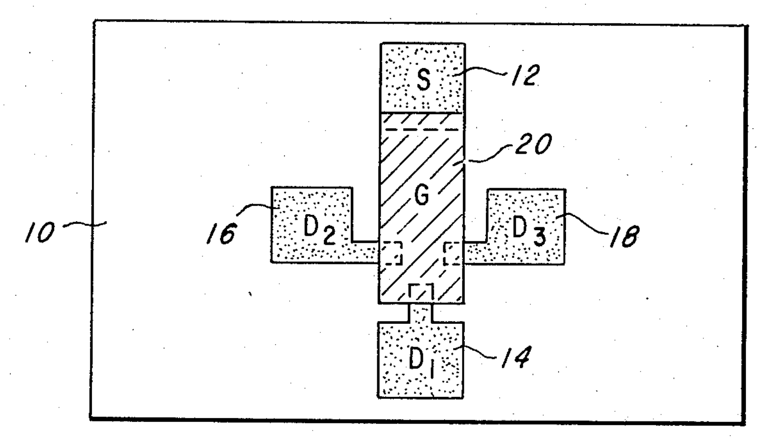

FIGS. 2 and 3 depict alternate configurations of three-drain insulated gate field effect transistors which may be utilized in accordance with the present invention, using the same biasing technique as described with reference to FIG. 1. These configurations also exhibit significant improvements in signal-to-noise ratio and sensitivity as compared to the conventional mode of operation of magnetic field detectors comprising a three-drain configured insulated gate field effect transistor.

Since the detector does not operate in a transistor mode, the IGFET structure is not essential for operation and in some applications it may be desirable to eliminate the conductive layer 20 entirely to simplify fabrication. Reliability would also be improved since the thin insulating layer would no longer be required.

Figure 5:
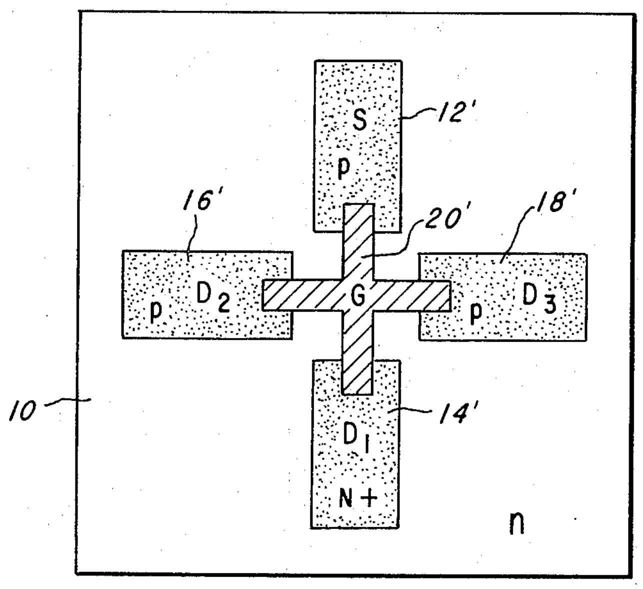
FIG. 5 is a plan view of an embodiment of the invention wherein one of the drain regions is replaced by a region of the same conductivity type as the substrate.

With reference to FIG. 5, there is illustrated in plan view a structure that may be utilized to detect a magnetic field and which exhibits significantly less power dissipation than the embodiments illustrated in FIGS. 1–3. This embodiment of the invention does not require avalanche breakdown. For this structure, assuming an N-type substrate, the regions 12′, 16′ and 18′ are formed as described in FIG. 1 to be pockets of P conductivity type material. The region 14′ opposite the source 12′ is formed to be $N^+$conductivity type. A gate region is not required for operation in this mode. Again the source region 12′ is considered substrate ground. The two drain regions 16′ and 18′ are again biased to a value less than that required for avalanche breakdown. The region 14′ however, which is the $N^+$ region, is biased to a value significantly less than the bias applied to the drains 16′ and 18′. Preferably the bias supplied to the region 14′ is on the order of minus 10 volts or less. For this structure hole current flows from the source 12′ to the diffused region 14′. This hole current will be deflected by an applied magnetic field as above discussed and detected by a voltage change across the two regions 16′ and 18′. The $N^+$ region 14′ typically has an impurity concentration on the order of $10^{17}$ atoms/$cm^3$ or greater.

In some applications, such as for example, the detection of the magnetic field associated with a magnetic bubble, i.e., a magnetic domain which is propagated in a thin platelet of magnetic material, (such as disclosed in copending application, Ser. No. 129,423, entitled MAGNETIC DOMAIN MEMORY STRUCTURE, filed Mar. 30, 1971, now U.S. Pat. No. 3,702,991 issued Nov. 14, 1972), it may be desirable to form a conductive region overlying the regions 12′, 16′, 18′ and 14′ analogous to an insulated gate field effect transistor structure. Such a conductive layer connected to circuit ground, or biased to a value below threshold of an IGFET device, would be effective to concentrate minority carriers near the surface of the semiconductor material intermediate the region 12′ and 14′. This would enhance detection of the localized field of a magnetic bubble domain.

Figure 6:
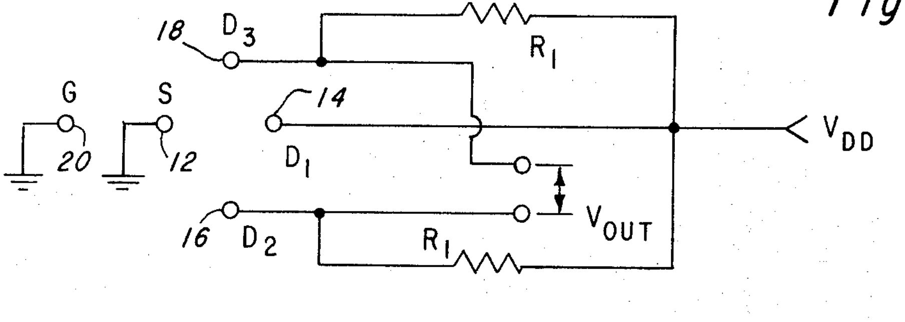
FIG. 6 is a schematic of a biasing circuit which may be used to achieve the high sensitivity mode of operation of the present invention.

With reference to FIG. 6 a biasing circuit is illustrated that may be utilized to achieve the high sensitivity mode of operation of the present invention. The resistors R1 are connected between the drains 16 and 18, respectively, and the voltage source $V_{DD}$ and are effective to prevent these drain regions from avalanching since the voltage generated across these resistors serves to de-bias these regions. The drain region 14 is connected directly to the source $V_{DD}$ such that the level of voltage applied thereto may be effective to produce avalanche. The output voltage is detected across the drains 16 and 18 and is effective to provide a signal in response to an applied magnetic field.

While the present invention has been described with respect to specific embodiments it will be apparent to a person skilled in the art that various modifications to the details of construction may be made without departing from the scope or spirit of the present invention.

What is claimed is:

1. A magnetic field detector comprising:

a semiconductor substrate of one conductivity type;

a first region of opposite conductivity type extending into said substrate from one surface thereof;

a second region of said one conductivity type extending into said substrate from said one surface and of higher conductivity than said substrate, said second region being spaced from said first region and arranged in substantially bilaterally symmetrical registration therewith;

third and fourth regions of said opposite conductivity type extending into said substrate from said one surface and positioned on opposite sides of a straight line extending between and bisecting said first and second regions, said third and foruth regions being spaced from each other and from said first and second regions respectively; and said third and fourth regions being effective to generate a voltage thereacross in response to a magnetic field substantially perpendicular to the plane of said substrate when said first, second, third and fourth regions are appropriately biased.

2. A magnetic field detector as set forth in claim 1, further including a first insulating layer disposed over said substrate and each of said first, second, third, and fourth regions defined therein;

said first insulating layer having a first aperture formed therein, said first aperture in said first insulating layer exposing a portion of said substrate located substantially centrally with respect to said four regions defined therein and including marginal portions of each of said four regions;

a second insulating layer relatively thin with respect to said first insulating layer, said second insulating layer being disposed in said first aperture in said first insulating layer and covering the portion of said substrate located substantially centrally with respect to said four regions and the said marginal portions of each of said four regions; and a conductive layer disposed on said second insulating layer in overlying relationship and extending into at least partially overlying but spaced relationship with respect to each of said four regions.

3. A magnetic field detector as set forth in claim 2 including means for connecting said conductive layer to circuit ground.

4. A magnetic field detector as set forth in claim 2, wherein said means for connecting said conductive layer to circuit ground comprises a second aperture formed in said first insulating layer and exposing another portion of said substrate outwardly with respect to said portion of said substrate located substantially centrally with respect to said four regions; and said conductive layer extending into said second aperture in said first insulating layer into contact with said substrate.

5. A magnetic field detector as set forth in claim 4, wherein said substrate is n type silicon, said second region is n+ type silicon, and said first, third, and fourth regions are p type silicon.

* * * * *